United States Patent
Zheng et al.

(10) Patent No.: US 7,820,245 B2
(45) Date of Patent: Oct. 26, 2010

(54) METHOD OF SYNTHESIZING SINGLE-WALL CARBON NANOTUBES

(75) Inventors: Zhi Zheng, Beijing (CN); Yuan Yao, Beijing (CN); Liang Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 603 days.

(21) Appl. No.: 11/655,424

(22) Filed: Jan. 19, 2007

(65) Prior Publication Data

US 2008/0014346 A1    Jan. 17, 2008

(30) Foreign Application Priority Data

Jul. 12, 2006    (CN)    ............ 2006 1 0061618

(51) Int. Cl.
    *C23C 16/00*    (2006.01)
(52) U.S. Cl. ............... 427/249.1; 427/248.1; 427/402; 427/419.2; 977/890; 977/891
(58) Field of Classification Search ............... 427/402, 427/372.2, 375, 377, 301, 249.1
    See application file for complete search history.

(56) References Cited

U.S. PATENT DOCUMENTS

| | | | |
|---|---|---|---|
| 6,097,138 A | 8/2000 | Nakamoto et al. | |
| 6,514,113 B1 | 2/2003 | Lee et al. | |
| 6,808,746 B1 * | 10/2004 | Dai et al. | ............ 427/249.1 |
| 2002/0014667 A1 * | 2/2002 | Shin et al. | ............ 257/368 |
| 2002/0172767 A1 * | 11/2002 | Grigorian et al. | ...... 427/255.28 |
| 2004/0037767 A1 * | 2/2004 | Adderton et al. | ......... 423/447.3 |
| 2004/0053440 A1 * | 3/2004 | Lai et al. | ............ 438/105 |
| 2004/0101468 A1 | 5/2004 | Liu et al. | |
| 2007/0053824 A1 * | 3/2007 | Subramanya et al. | .... 423/447.3 |
| 2008/0206463 A1 * | 8/2008 | Grigorian et al. | ......... 427/249.1 |

FOREIGN PATENT DOCUMENTS

TW    200409830    6/2004

OTHER PUBLICATIONS

Lacerda et al. Thin-Film metal catalyst for the production of multi-wall and single-wall carbon nanotubes. Oct. 15, 2004, Journal of Applied Physics, vol. 96, No. 8, pp. 4456-4462.*

Zhang et al. Chemical Vapor Deposition of Single-Walled Carbon Nanotubes Using Ultrathin Ni/Al Film as Catalyst. Apr. 29, 2003. Nano Letters, vol. 3, No. 6 731-735.*

* cited by examiner

*Primary Examiner*—David Turocy
(74) *Attorney, Agent, or Firm*—Jeffrey T. Knapp

(57) ABSTRACT

A method for synthesizing single-wall carbon nanotubes (SWNTs) generally includes the steps of: providing a substrate having an upper portion comprised of indium tin oxide; forming an aluminum layer on the upper portion of the substrate; forming a catalyst layer on the aluminum layer to obtain a treated substrate; annealing the treated substrate so as to transform the catalyst layer into a plurality of oxidized catalyst particles on the substrate; and growing a plurality of single-wall carbon nanotubes on the treated substrate using a chemical vapor deposition process.

17 Claims, 4 Drawing Sheets

METHOD OF SYNTHESIZING SINGLE-WALL CARBON NANOTUBES

BACKGROUND

1. Technical Field

The invention relates generally to methods of synthesizing carbon nanotubes and, particularly, to a method of synthesizing single-wall carbon nanotubes (SWNTs) at a relatively low temperature.

2. Discussion of Related Art

Single-wall carbon nanotubes (SWNTs) are widely used in many fields including, for example, microelectronic technologies, nano-scaled elements, thermal interface materials, hydrogen storage technologies, etc. Additionally, since a field emission subthreshold voltage of SWNTs is much lower than that of multi-wall carbon nanotubes (MWNTs), a field emission device, that employs the SWNTs as a field emission cathode, can work at a relatively lower voltage. Thus, a power consumption of the field emission device with SWNTs is greatly lower than that of a field emission device, that employs MWNTs as a field emission cathode.

At present, traditional methods of synthesizing SWNTs include an arc-discharge method, a laser evaporation method, a solar energy method, a catalyst thermal dissociation method, and so on. In the above traditional methods, the catalyst thermal dissociation method is suited to form the SWNTs in mass production, but it is performed at a relatively high temperature.

What is needed, therefore, is a method of synthesizing SWNTs at a relatively low temperature.

SUMMARY

A method of synthesizing single-wall carbon nanotubes (SWNTs) generally includes the steps of:

(i) providing a substrate having an upper portion and a lower portion, the upper portion comprised of indium tin oxide and having a thickness in the range of about 5 nanometers to about 100 nanometers, the lower portion being advantageously comprised of one of silicon and silicon oxide, e.g., quartz or glass;

(ii) depositing an aluminum layer on the upper portion of the substrate, the aluminum layer having a thickness in the range from about 5 nanometers to about 40 nanometers;

(iii) depositing a catalyst layer with a suited thickness on the aluminum layer, thereby forming a treated substrate;

(iv) annealing the treated substrate at a temperature of about 300° C. to about 500° C. for a sufficient period of time (e.g., from about 10 minutes to about 12 hours) in air, in order to oxidize the catalyst layer to form oxidized catalyst particles; and (v) placing the treated substrate into a reactive device, and heating them up to a predetermined temperature (e.g., about 630° C. to about 900° C.) in a flow of a protective gas; and (vii) introducing a mixing gas of the protective gas and a carbon source gas, and heating at a temperature of about 630° C. to about 900° C. for a sufficient period of time (e.g., about 30 minutes to about 60 minutes), thereby forming the SWNTs.

Other advantages and novel features of the present method will become more apparent from the following detailed description of preferred embodiments when taken in conjunction with the accompanying drawings.

BRIEF DESCRIPTION OF THE DRAWINGS

Many aspects of the present method can be better understood with reference to the following drawings. The components in the drawings are not necessarily to scale, the emphasis instead being placed upon clearly illustrating the principles of the present method. Moreover, in the drawings, like reference numerals designate corresponding parts throughout the several views.

The exemplifications set out herein illustrate at least one preferred embodiment of the present method, in one form, and such exemplifications are not to be construed as limiting the scope of such a method in any manner.

DETAILED DESCRIPTION

Reference will now be made to the drawings to describe the synthesis of single-wall carbon nanotubes (SWNTs) at a relatively low temperature according to the present method in detail.

Figure 1:
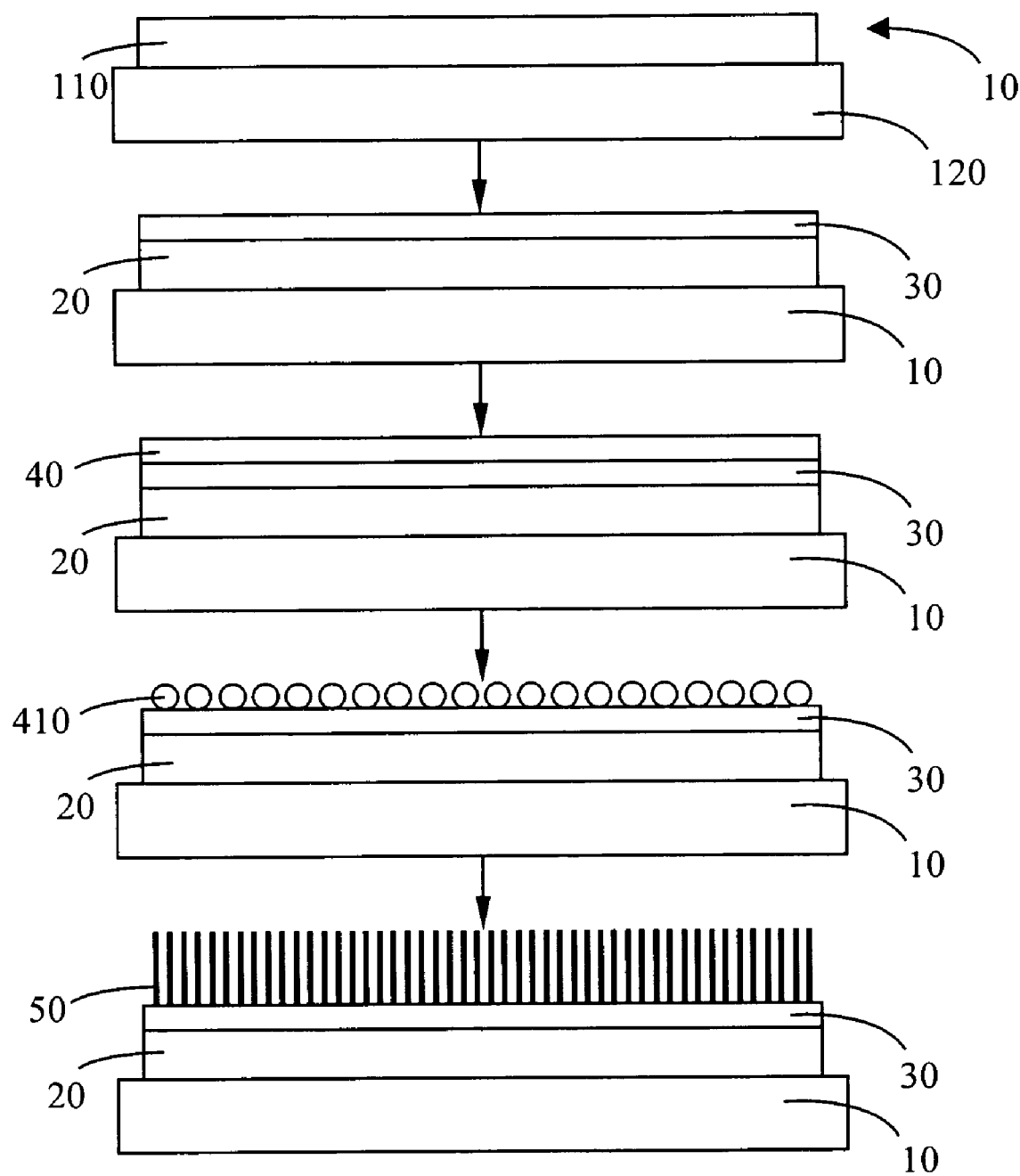
FIG. 1 is flow views showing successive stages in a method of synthesizing single-wall carbon nanotubes (SWNTs).

Referring to FIG. 1, a method of synthesizing single-wall carbon nanotubes (SWNTs) is provided. The method includes the steps of:

(i) providing a substrate 10 having an upper portion 110 and a lower portion 120, the upper portion 110 comprised of indium tin oxide and having a thickness in the range of about 5 nanometers to about 100 nanometers, the lower portion 120 advantageously comprised of one of silicon and silicon oxide, e.g., quartz or glass;

(ii) forming an aluminum layer 30 on the upper portion 110 of the substrate 10 by, e.g., an evaporating method or a sputtering method, the aluminum layer 30 having a thickness in the range from about 5 nanometers to about 10 nanometers, advantageously, the thickness of the aluminum layer 30 being about 40 nanometers;

(iii) depositing a catalyst layer 40 with a suited thickness on the aluminum layer 30 to form a treated substrate, the catalyst layer 40 comprised of a material selected from a group consisting of iron (Fe), cobalt (Co), nickel (Ni) and an alloy including by at least two such metals, the thickness of the catalyst layer 40 corresponding to the selective materials of the catalyst layer 40, e.g., the thickness of an Fe catalyst layer 40 being advantageously in the range from about 3 nanometers to about 10 nanometers and being preferably 5 nanometers;

(iv) annealing the treated substrate 10 at a temperature of about 300° C. to about 500° C. for a sufficient period of time (e.g., about 10 minutes to about 12 hours), in order to oxidize the catalyst layer 40 to form oxidized catalyst particles; and (v) positioning the substrate 10 in a reactive device (not shown in the drawings), that is suited to performing a chemical vapor deposition (CVD) method, heating the substrate 10 up to a predetermined temperature in a flow of a protective gas, introducing a mixing gas of the protective gas and a carbon source gas, and heating at a sufficient temperature (e.g., about 630° C. to about 900° C.) for a period of time from about 30 minutes to about 60 minutes, thereby resulting in SWNTs being formed.

In step (i), the upper portion 110 of the substrate 10 could be an ITO electrode using, e.g., a photolithography method, a method combining an electron beam photolithography technology with a reactive ion etching technology, a dry-etching method or a wet-etching method.

The photolithography method of forming the ITO electrode generally includes the steps of:

moving the substrate 10 into a vacuum chamber, sputtering a piezoelectric layer in a flow of a sputtering gas of a combination of argon (Ar) and oxygen ($O_2$) by, e.g., a reactive direct current (DC) sputtering method or a reactive radio frequency (RF) sputtering method, a sputtering material selected from a group consisting of $ZnO_x$, $LiNbO_x$, $LiTiO_x$, and $LiTaO_x$, a thickness of the piezoelectricity layer being in the range from about 0.02 micrometers to about 5 micrometers;

forming a photo-resist layer on a surface of the piezoelectric layer by, for example, a spin-coating method;

placing a photomask on the photo-resist layer, the photomask having a given pattern corresponding to the ITO electrode;

irradiating the photomask by a laser or an ultraviolet to result in an exposal portion of the photo-resist layer;

removing the photomask, developing the photo-resist and removing the exposal portion of the photo-resist layer thereby exposing a portion of the piezoelectric layer;

forming an ITO layer on the treated surface of the substrate 10, the ITO layer having a thickness in the range from about 5 nanometers to about 100 nanometers; and removing a remaining portion of the photo-resist with a portion of the ITO layer formed thereon and, the remaining ITO layer forming the ITO electrode.

The web-etching method of forming the ITO electrode generally includes the steps of:

providing an ITO layer on the substrate 10 by, e.g., an evaporating method or a sputtering method, the ITO layer having a thickness in the range from about 5 nanometers to about 100 nanometers;

forming an etching protective layer (e.g., a photo resist layer) on a surface of the ITO layer;

developing and removing a selective portion of the photoresist, in order to selectively expose a portion of the ITO layer;

providing an electrolyte etchant including a non-reactant, that is selected from one of a neutral salt, an acid and a base and does not react with the ITO layer via an etching reaction, and an oxide reactant, that reacts with the ITO layer via an etching reaction, the etchant etching and removing the exposal portion of the ITO layer via an electrochemical or chemical reaction; and removing a remaining etching protective layer using a solvent (e.g., acetone), and a remaining portion of the ITO layer forming the ITO electrode.

In step v, a function of the process of heating the substrate 10 up to the predetermined temperature in the flow of the protective gas is to protect the oxidized catalyst particles from a further oxidization during the synthesis of the SWNTs, thereby ensuring a desired condition for synthesizing the SWNTs. The predetermined temperature is different in accordance with different kinds of the catalyst. Generally, the predetermined temperature is in the range from about 400° C. to about 750° C. If iron is selected to be the catalyst, the predetermined temperature is advantageously about 650° C. The protective gas is selected from one of nitrogen ($N_2$) and inert gases, and, preferably, the protective gas is Ar. After the process of the heating the substrate 10 up to the predetermined temperature in the flow of the protective gas, hydrogen or an ammonia gas could be introduced to deoxidize the oxidized catalyst particles thereby obtaining nano-scaled catalyst particles. The carbon source gas in the mixing gas can be a hydrocarbon, such as acetylene or ethylene, preferably, the carbon source gas is acetylene. The protective gas in the mixing gas is advantageously Ar.

Figure 2:
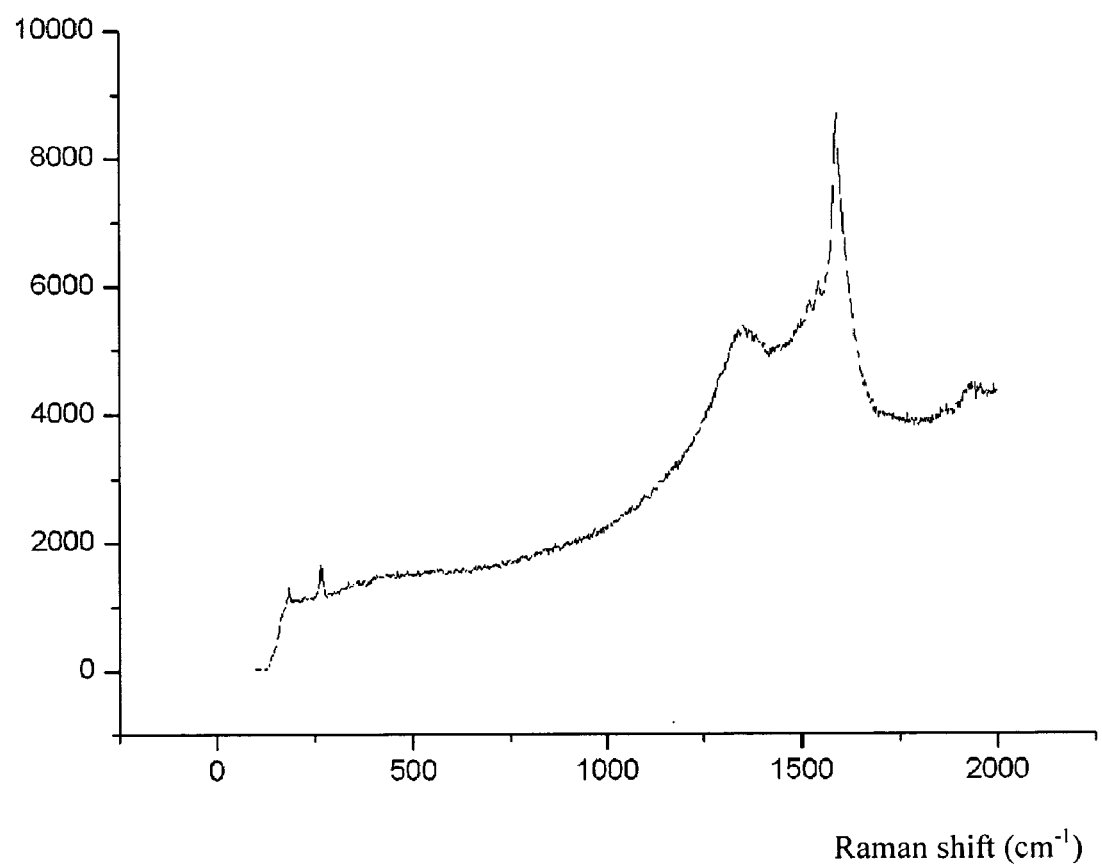
FIG. 2 is a Raman scattering spectrum of SWNTs synthesized by the present method.

Referring to FIG. 2, a Raman scattering spectrum of SWNTs synthesized by a method in accordance with the present method is shown. A series of wave crests between 175 1/cm and 300 1/cm shows breathing mode characteristics of the SWNTs. The detailed method synthesizing the SWNTs having the characteristics in FIG. 2 includes the steps:

providing a substrate with a ITO upper portion and a glass lower portion;

sputtering an aluminum layer with a thickness of about 40 nanometers on the upper portion of the substrate;

sputtering an Fe catalyst layer with a thickness of about 5 nanometers on the aluminum layer to form a treated substrate;

annealing the treated substrate at a temperature of about 300° C. for a time period of about 10 minutes in air, in order to form ferric oxide particles;

placing the substrate into a quartz carrier, removing the quartz carrier with the substrate into a reactive room of a tube quartz stove, introducing Ar and heating them to a temperature of about 640° C.;

introducing hydrogen to deoxidize the ferric oxide particles into nano-scaled Fe particles;

applying a mixing gas of Ar and acetylene, heating up to a temperature of about 640° C. for a time period of about 40 minutes, thereby obtaining the SWNTs.

Figure 3:
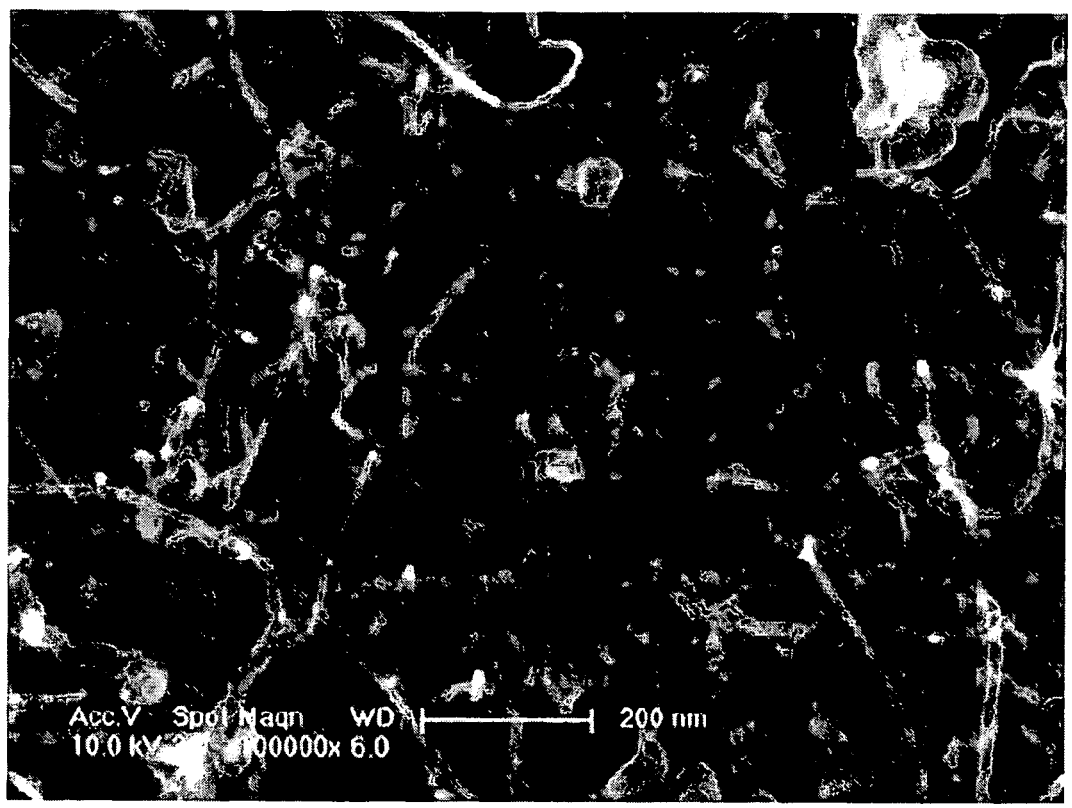
FIG. 3 is a scanning electron microscope (SEM) photo of SWNTs synthesized by the present method.
Figure 4:
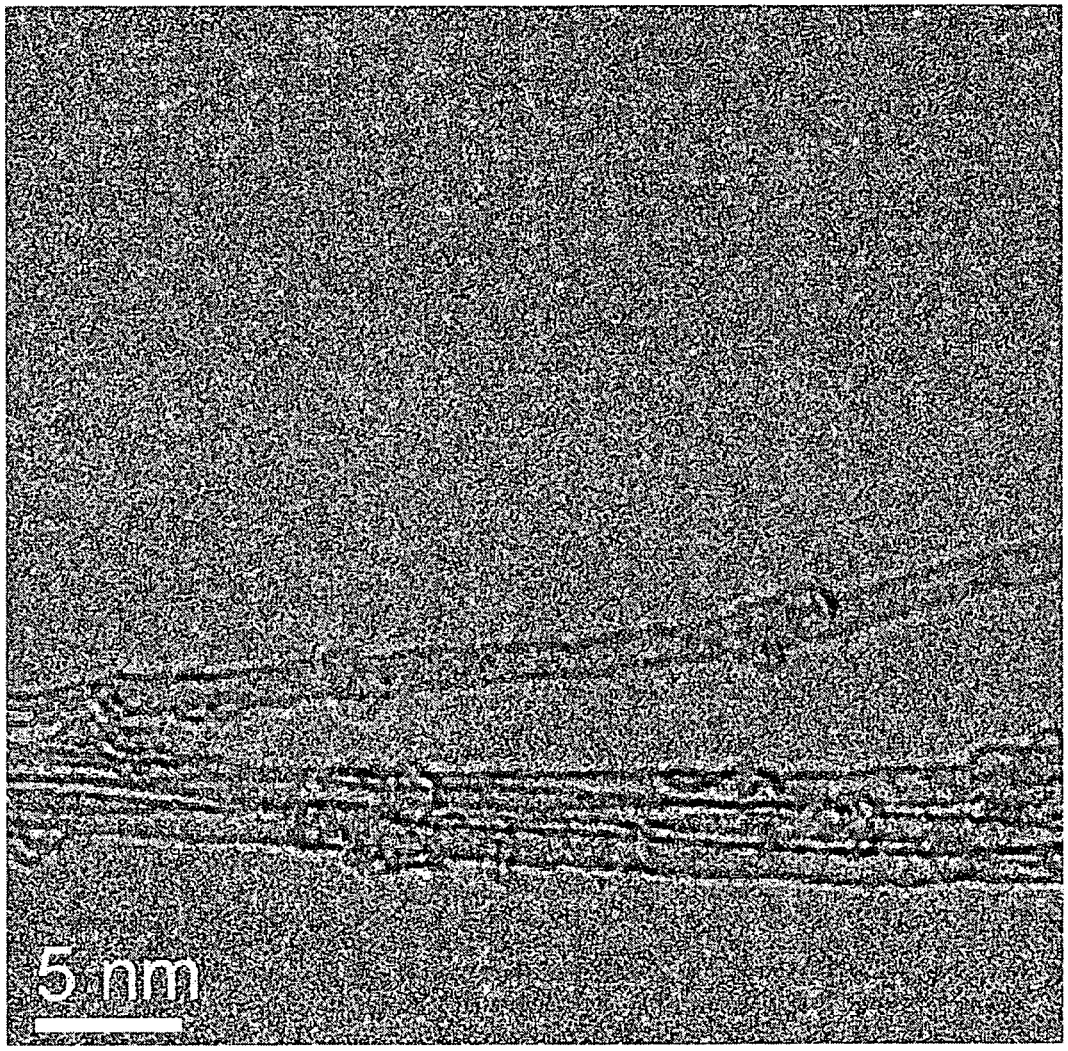
FIG. 4 is a transmission electron microscope (TEM) photo of the SWNTs in FIG. 3.

Referring to FIGS. 3 and 4, FIG. 3 is a scanning electron microscope (SEM) photo of SWNTs synthesized by a method in accordance with the present method, and FIG. 4 is a transmission electron microscope (TEM) photo of the SWNTs in FIG. 3. The detailed method of synthesizing the SWNTs shown in FIGS. 3 and 4 includes the steps of:

providing a silicon base;

evaporating an ITO layer with a thickness of about 100 nanometers on a top surface of the silicon base, the silicon base and the ITO layer forming a substrate;

sputtering an aluminum layer with a thickness of about 40 nanometers on the ITO layer;

sputtering an Fe catalyst layer with a thickness of about 5 nanometers onto the aluminum layer to form a treated substrate;

annealing the treated substrate at a temperature of about 300° C. for a time period of about 10 minutes, to form ferric oxide particles;

placing the substrate with the ferric oxide particles into a quartz carrier, removing the quartz carrier into a reactive room of a tube quartz stove;

heating the substrate up to a temperature of about 740° C. in a flow of Ar; and introducing a mixing gas of Ar and acetylene, and heating up to a temperature of about 740° C. for a time period of about 40 minutes, thereby obtaining the SWNTs.

In a method of synthesizing carbon nanotubes, that has similar conditions to the present method except for the ITO portion and the aluminum layer of present invention, only multi-wall carbon nanotubes (MWNTs) are found but SWNTs are not found.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claim is:

1. A method of synthesizing single-wall carbon nanotubes, comprising the steps of:
   providing a substrate having an upper portion comprised of indium tin oxide (ITO);
   forming an aluminum layer on the upper portion of the substrate;
   forming a catalyst layer on the aluminum layer to obtain a treated substrate;
   annealing the treated substrate so as to transform the catalyst layer into a plurality of oxidized catalyst particles on the substrate; and
   growing a plurality of single-wall carbon nanotubes on the treated substrate using a chemical vapor deposition process,
   wherein the plurality of single-wall carbon nanotubes is grown on the treated substrate at a temperature of about 630° C. to about 740° C.

2. The method of synthesizing the single-wall carbon nanotubes as described in claim 1, wherein the substrate has a low portion comprised of indium tin oxide.

3. The method of synthesizing the single-wall carbon nanotubes as described in claim 1, wherein the substrate has a lower portion comprised of a material selected from one of silicon, silicon oxide and quartz, and the upper portion of the indium tin oxide is formed on the lower portion.

4. The method of synthesizing the single-wall carbon nanotubes as described in claim 3, wherein the upper portion of the indium tin oxide has a thickness of about 5 nanometers to about 100 nanometers.

5. The method of synthesizing the single-wall carbon nanotubes as described in claim 1, further comprising a step of introducing a gas selected from a group consisting of hydrogen gas and ammonia gas to deoxidize the oxidized catalyst particles into nano-sized catalyst particles.

6. The method of synthesizing the single-wall carbon nanotubes as described in claim 1, wherein the aluminum layer has a thickness of about 5 nanometers to about 40 nanometers.

7. The method of synthesizing the single-wall carbon nanotubes as described in claim 1, wherein the treated substrate is annealed at a temperature of about 300° C. to about 500° C. for a time period of about 10 minutes to about 12 hours.

8. The method of synthesizing the single-wall carbon nanotubes as described in claim 1, wherein the upper portion is an indium tin oxide layer, the plurality of single-wall carbon nanotubes has a growth direction substantially vertical to the tin oxide layer.

9. The method of synthesizing the single-wall carbon nanotubes as described in claim 1, wherein the upper portion of the substrate is an electrode made by a photolithography method, a method combining an electron beam photolithography technology with a reactive ion etching technology, a dry-etching method or a wet-etching method.

10. The method of synthesizing the single-wall carbon nanotubes as described in claim 9, wherein the photolithography method of forming the ITO electrode includes the steps of:
    moving the substrate into a vacuum chamber;
    sputtering a piezoelectric layer in a flow of a sputtering gas of a combination of argon (Ar) and oxygen (O2), a thickness of the piezoelectricity layer being in the range from about 0.02 micrometers to about 5 micrometers;
    forming a photo-resist layer on a surface of the piezoelectric layer;
    placing a photomask on the photo-resist layer, the photomask having a given pattern corresponding to the ITO electrode;
    irradiating the photomask by a laser or ultraviolet to result in an exposal portion of the photo-resist layer;
    removing the photomask, developing the photo-resist layer and removing the exposal portion of the photo-resist layer thereby exposing a portion of the piezoelectric layer;
    forming an ITO layer on the treated surface of the substrate, the ITO layer having a thickness in the range from about 5 nanometers to about 100 nanometers; and
    removing a remaining portion of the photo-resist layer with a portion of the ITO layer formed thereon, a remaining portion of the ITO layer forming the ITO electrode.

11. The method of synthesizing the single-wall carbon nanotubes as described in claim 9, wherein the web-etching method of forming the ITO electrode includes the steps of:
    providing an ITO layer on the substrate, the ITO layer having a thickness in the range from about 5 nanometers to about 100 nanometers;
    forming an etching protective layer on a surface of the ITO layer;
    developing and removing a selective portion of the etching protective layer, to selectively expose a portion of the ITO layer;
    providing an electrolyte etchant including a non-reactant that does not react with the ITO layer via an etching reaction, the non-reactant being a neutral salt, an acid or a base, and removing the exposal portion of the ITO layer via an electrochemical or chemical reaction; and
    removing a remaining etching protective layer using a solvent, a remaining portion of the ITO layer forming the ITO electrode.

12. A method of synthesizing single-wall carbon nanotubes comprising the steps of:
    providing a substrate comprised of indium tin oxide;
    depositing an aluminum layer on the substrate, the aluminum layer having a thickness of about 5 nanometers to about 40 nanometers;
    depositing a catalyst layer on the aluminum layer;
    annealing the treated substrate so as to create a plurality of oxidized catalyst particles on the substrate;
    heating the substrate in a flow of a protective gas; and
    introducing a mixing gas of the protective gas and a carbon source gas at a temperature in the range from about 630° C. to about 740° C. for a time period of about 40 minutes to about 60 minutes, thereby obtaining the single-wall carbon nanotubes.

13. The method of synthesizing the single-wall carbon nanotubes as described in claim 12, wherein the step of annealing is performed at a temperature of about 300° C. to about 500° C. for a time period of about 10 minutes to about 12 hours.

14. The method of synthesizing the single-wall carbon nanotubes as described in claim 12, wherein the substrate is heated up to a temperature in the range from about 630° C. to about 900° C. in the flow of a protective gas.

15. A method of synthesizing single-wall carbon nanotubes comprising the steps of:
    providing a substrate having an upper portion comprised of indium tin oxide;
    depositing an aluminum layer on the upper portion of the substrate, the aluminum layer having a thickness of about 5 nanometers to about 40 nanometers;
    depositing a catalyst layer on the aluminum layer;
    heating the substrate in a flow of a protective gas; and introducing a mixing gas of the protective gas and a carbon source gas, at a temperature in the range from about 630° C. to about 740° C. for a time period of about 40 minutes to about 60 minutes, thereby obtaining the single-wall carbon nanotubes.

16. The method of synthesizing the single-wall carbon nanotubes as described in claim 15, further comprising a step of annealing the treated substrate so as to form oxidized catalyst particles on the substrate is provided.

17. The method of synthesizing the single-wall carbon nanotubes as described in claim 16, wherein the catalyst layer is comprised of iron and has a thickness in the range from about 3 nanometers to about 10 nanometers.

* * * * *